United States Patent [19]

Itoh

[11] 4,203,056
[45] May 13, 1980

[54] VERTICAL DEFLECTION CIRCUIT

[75] Inventor: Takashi Itoh, Yokohama, Japan

[73] Assignee: Hitachi, Ltd., Japan

[21] Appl. No.: 4,221

[22] Filed: Jan. 17, 1979

[30] Foreign Application Priority Data

Jan. 20, 1978 [JP] Japan .................................. 53-4378

[51] Int. Cl.² ........................................ H01J 29/70
[52] U.S. Cl. ..................................... 315/389; 315/397
[58] Field of Search ....................... 315/389, 397, 396

[56] References Cited

U.S. PATENT DOCUMENTS

| 3,426,245 | 2/1969 | Yurasek et al. | 315/389 |
| 3,781,589 | 12/1973 | Brockmann | 315/397 X |
| 3,986,077 | 10/1976 | Araź | 314/389 |
| 4,023,069 | 5/1977 | Peer | 315/397 |
| 4,119,891 | 10/1978 | Soldner et al. | 315/389 |

*Primary Examiner*—Malcolm F. Hubler
*Attorney, Agent, or Firm*—Craig and Antonelli

[57] ABSTRACT

Disclosed is a vertical deflection circuit in which first and second NPN output transistors are connected in series to make up a single-ended push-pull circuit. A vertical deflection coil and a low-value resistor are connected in series between the output terminal of the push-pull circuit and the earth. The second NPN output transistor is driven by a driving transistor which amplifies the oscillated signal produced from a vertical oscillation stage. The voltage generated at the junction point of the vertical deflection coil and the low-value resistor is fed back to the driving transistor. An emitter resistor is inserted between the emitter of the second NPN output transistor and the earth, while a resistor for differentiating the amount of feedback in the former and latter halves of the vertical scanning period is inserted between the emitter of the second NPN transistor and the junction point.

4 Claims, 4 Drawing Figures

VERTICAL DEFLECTION CIRCUIT

BACKGROUND OF THE INVENTION

1. Field of the Invention

The present invention relates to a vertical deflection circuit with an improved linearity.

2. Description of the Prior Art

In the vertical deflection circuit, it is important to maintain a superior linearity of deflection. For this purpose, a resistor with a low resistance value is connected in series with a vertical deflection coil, and a saw-tooth wave voltage generated across this low-value resistor is negatively fed back to a driving stage for driving a vertical output stage.

Such a vertical deflection circuit is disclosed, for instance, in Japanese Patent Publication No. 37,732/76. In this well-known vertical deflection circuit, it is impossible to obtain satisfactory linearity characteristics unless a trapezoidal wave voltage supplied to the driving stage is stabilized on the one hand and the variation in the amplification degree of transistors making up the driving stage and the vertical output stage is reduced on the other hand.

Another well-known type of vertical deflection circuit is such that a saw-tooth wave voltage is applied to the driving stage, and another saw-tooth wave voltage generated across the low-value resistor in series with the vertical deflection coil is negatively fed back to the driving stage, and these two saw-tooth voltage are used to produce a trapezoidal wave voltage at the output of the driving stage, thus improving the stability. In this prior vertical deflection circuit, however, the trapezoidal wave voltage produced at the output of the driving stage is not sufficient to directly drive the vertical output stage including two NPN output transistors connected in single-ended push-pull. If the vertical output stage is directly driven, the linearity is deteriorated for the reason mentioned below.

The two NPN output transistors are arranged in such a manner that the collector-emitter circuit thereof is connected in series between the positive pole of a DC power supply and the earth, and the NPN output transistor on the positive pole side conducts in the former half of the vertical scanning period and acts as an emitter follower, while it is cut off in the latter half of the vertical scanning period. The NPN output transistor on the earth side, on the other hand, conducts during the vertical scanning period and acts as an emitter-grounded transistor. In the former half of the vertical scanning period, all the emitter current of the NPN output transistor on the positive pole side flows through the vertical deflection coil, and therefore the NPN output transistor on the positive pole side fails to make up a collector load of the earth-side NPN output transistor. Namely, the collector load of the earth-side NPN output transistor is formed by a base bias circuit of the NPN output transistor on the positive pole side during the former half of the vertical scanning period, while it is formed by a series circuit including the vertical deflection coil and the low-value resistor in the latter half of the vertical scanning period. The ratio of change in this collector load is 1/10 or less than 1/10. Therefore, the mutual conductance, that is the ratio between the input voltage applied to the driving stage and the output current produced from the output stage assumes, in the latter half of the vertical scanning period becomes, several percents of the value for the former half thereof. As a result, the lower part of the reproduced picture in TV is "crimped". In other words, the amplification degree of the vertical output stage in the former half of the vertical scanning period is so different from that in the latter half thereof that the linearity of vertical deflection signal is deteriorated.

SUMMARY OF THE INVENTION

An object of the present invention is to provide a vertical deflection circuit capable of producing a vertical deflection current with a superior linearity.

In order to achieve the above-mentioned object, the amount of negative feedback in the first period (former half of the vertical scanning period) in which the amplification degree of the vertical output stage is high is increased as compared with that in the second period (latter half of the vertical scanning period) in which the amplification degree of the vertical output stage is low, thus maintaining the amplification degree of the vertical deflection circuit at a fixed level.

The above and other objects, features and advantages of the present invention will be more clear from the following description with reference to the accompanying drawings.

DESCRIPTION OF THE PREFERRED EMBODIMENT

Figure 1:
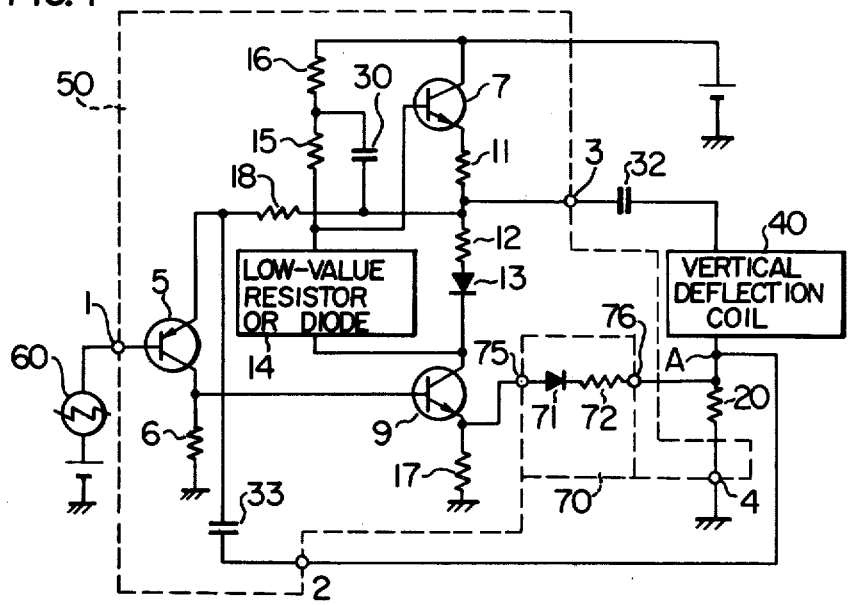
FIG. 1 shows a circuit diagram of an embodiment of a vertical deflection circuit.

In FIG. 1, reference numeral 1 shows an input terminal receiving a saw-tooth wave voltage for vertical scanning applied from the vertical oscillator 60, numeral 2 an input terminal to which a sample voltage obtained by sampling the vertical deflection current flowing through the vertical deflection coil 40 by a low-value resistor 20 is negatively fed back, numeral 3 an output terminal for obtaining a saw-tooth wave current, and numeral 4 an earth terminal connected to the earth. Numeral 5 shows a driving transistor, numeral 6 a collector load resistor of the driving transistor 5, numerals 7 and 9 NPN output transistors making up a single ended push-pull circuit, numerals 11 and 12 balancing resistors for balancing the characteristics of the NPN output transistors 7 and 9, and numeral 13 a diode for blocking a reverse current. Numeral 14 shows an element such as a low-value resistor or a diode, which together with resistors 15 and 16 and a bootstrap capacitor 30, makes up the base bias circuit for the NPN output transistor 7, while the resistor 17 constitutes the emitter bias circuit for the NPN output transistor 9. The resistor 18, in cooperation with the capacitor 33, feeds back the DC component of the output voltage at the output terminal 3 to the emitter of the driving transistor 5. The capacitors 32 and 33 remove the DC components from the deflection current and the sample signal respectively.

The circuit part except for the negative feedback amount-correcting means 70 including a diode 71 and a resistor 72 connected in series between the terminal 75 connected to the emitter of the NPN output transistor 9 and the terminal 76 connected to the junction point A of the vertical deflection coil 40 and the low-value resistor 20 makes up a well-known vertical deflection circuit, the operation of which will not be explained.

In the former half of the vertical scanning period, the emitter current of the NPN output transistor 7 flows in the vertical deflection coil 40 through the capacitor 32 as a vertical deflection current, so that a positive voltage is generated at the junction point A and so the diode 71 is cut off. As a result, the amplifier circuit 50 including the driving transistor 5 and the NPN output transistors 7 and 9 is not in the least affected by the negative feedback amount-correcting means 70. In the latter half of the vertical scanning period, by contrast, the collector current of the NPN output transistor 9 flows as a vertical deflection current through the vertical deflection coil 40, and therefore a negative voltage is generated at junction point A, thus turning on the diode 71. In this case, a part of the vertical deflection current flowing from the emitter of the NPN output transistor 9 to the vertical deflection coil 40 flows through the diode 71 and the resistor 72, thus reducing the current flowing through the low-value resistor 20 when compared with the current in the former half and therefore the amount of negative feedback is reduced. As a result, the amount of the decrease in amplification degree of the amplifier circuit 50 due to the negative feedback is reduced, and therefore the amplification degree of the amplifier circuit 50 is increased as compared with the case where the negative feedback amount-correcting means 70 is lacking. Thus the same amplification degree as in the former half of the vertical scanning period is attained in the latter half, thereby maintaining a superior linearity of the vertical deflection current.

Figure 2:
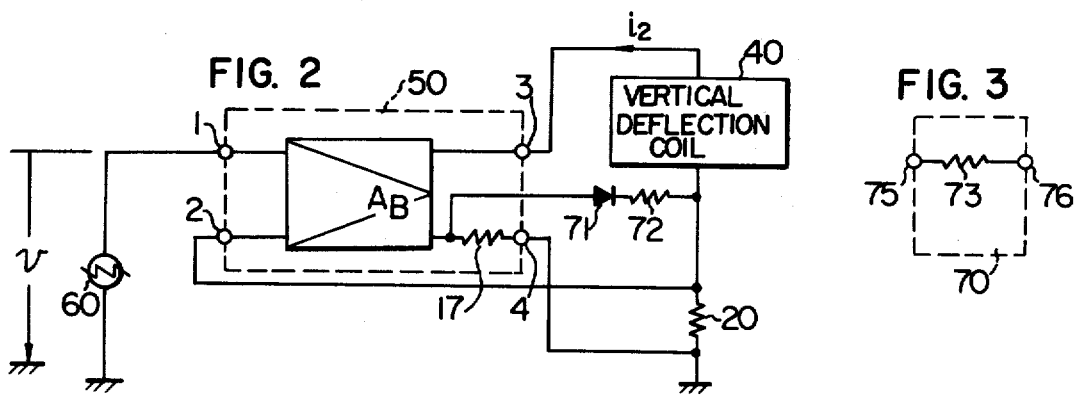
FIG. 2 shows an equivalent circuit of the vertical deflection circuit of FIG. 1.

This operation will be explained quantitatively in detail with reference to FIG. 2 showing the equivalent circuit of the vertical deflection circuit of FIG. 1.

First, the amount of voltage feedback $v_T$ in the former half of the vertical deflection period is given as $$V_T = i2 \cdot R20 \tag{1}$$

Similarly, the amount of voltage feedback $v_B$ in the latter half of the vertical deflection period is expressed as $$v_B = i2 \cdot \frac{R72 \cdot R20}{R20 + R17 + R72} \tag{2}$$

where R20 is the resistance value of the low-value resistor 20, R17 the resistance value of the resistor 17, R72 the resistance value of the resistor 72, and i2 the value of the vertical deflection current.

Therefore, the ratio $\alpha$ of the amount of feedback voltage $v_B$ of the latter half of the vertical scanning period to the amount of feedback voltage $v_T$ for the former half thereof is $$\alpha = \frac{v_B}{v_T} = \frac{R72}{R20 + R17 + R72} \tag{3}$$

As obvious from this equation (3), the value R72 of the resistor 72 may be increased in this embodiment. Therefore, the conduction characteristics of the diode 71 have a smaller effect to the amount of negative feedback value, thus making it possible to ignore the forward voltage of the diode 71. As a result, the circuit according to the invention is less adversely affected by the change of the characteristics of the diode due to temperature changes, and so a low-cost diode may be used.

Figure 3:
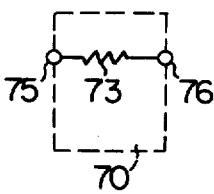
FIG. 3 shows another example of a negative feedback amount-correcting circuit means of FIG. 1.

The negative feedback amount-correcting means 70 may alternatively be configured in such a way that as shown in FIG. 3, wherein a resistor 73 is inserted between the terminals 75 and 76 without any diode.

In this case, the vertical deflection current in the former half of the vertical scanning period is divided into the resistor 20 and into the series circuit of the resistors 73 and 17.

The amount of voltage feedback $v_T'$ generated at the junction point A in the former half of the vertical scanning period is expressed as $$v_T' = i2 \cdot \frac{R20(R17 + R73)}{R20 + R17 + R73} \tag{4}$$

where R20 is the resistance value of the low-value resistor 20, R17 the resistance value of the resistor 17, R73 the resistance value of the resistor 73, and i2 the vertical deflection current.

In the latter half of the vertical scanning period, on the other hand, the vertical deflection current flows dividedly through the resistor 73 and through the series circuit of the resistors 17 and 20, and therefore the amount of voltage feedback $v_B'$ generated at the junction point A during this half period is given as $$v_B' = i2 \cdot \frac{R20 \cdot R73}{R20 + R17 + R73} \tag{5}$$

Thus the ratio $\alpha'$ of the amount of feedback $v_B'$ to $v_T'$ is expressed as $$\alpha' = \frac{v_B'}{v_T'} = \frac{R73}{R17 + R73} \tag{6}$$

It is obvious from equation (6) that the voltage feedback amount $v_T'$ in the former half of the vertical scanning period exceeds the voltage feedback amount $v_B'$ in the latter half of the vertical scanning period, so that the amplification degree of the amplifier circuit 50 for the former half of the vertical scanning period becomes equal to that for the latter half thereof.

Figure 4:
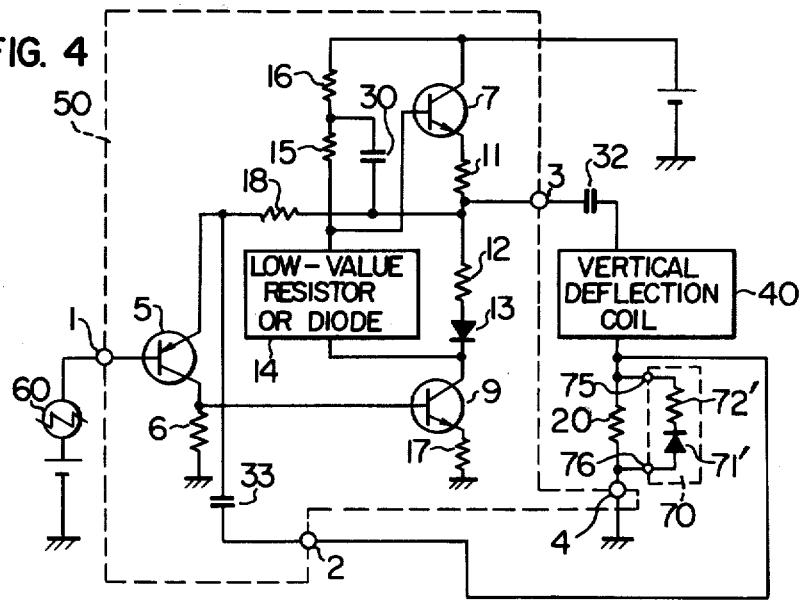
FIG. 4 shows a circuit diagram of another embodiment of a vertical deflection circuit.

The negative feedback amount-correcting means 70 may be constructed as another alternative example as shown in FIG. 4, in which a series circuit of a diode 71' and a resistor 72' is connected in parallel to the low-value resistor 20 for sampling the vertical deflection current.

The diode 71' is turned off during the former half of the vertical scanning period and turned on during the latter half thereof. Therefore, the vertical deflection current is sampled only by the resistor 20 during the former half of the vertical scanning period but by the parallel circuit of the resistors 20 and 72' during the latter half thereof. The result is that the negative feedback for the former half of the vertical scanning period is larger than that for the latter half thereof, so that the amplification degree of the amplifier circuit 50 for the former half of the vertical scanning period becomes equal to that for the latter half thereof.

The above-described negative feedback amount-correcting means 70 may be added not only to the vertical deflection circuit of which the amplification degree is different between the former and latter halves of the vertical scanning period but also to the vertical deflection circuit of which the amplification degree undergoes no change, in order to regulate the linearity.

I claim:

1. A vertical deflection circuit comprising:

a vertical deflection coil;

an amplifier for supplying a vertical deflection current to said vertical deflection coil in opposite directions, said ammplifier being a vertical output stage in which the amplifier degree for the first period when the vertical deflection current flows through said vertical deflection coil in one direction is higher than that for the second period when the vertical deflection current flows through said vertical deflection coil in the other direction opposite to the one direction;

a driving stage for driving said vertical output stage;

sampling means connected in series to said vertical deflection coil for sampling the vertical deflection current thereby generating a sample signal corresponding to the sampled vertical deflection current;

negative feedback means for negatively feeding back said sample signal to said driving stage; and negative feedback amount-correcting means connected to said sampling means for reducing the sampling signal negatively fed back in the second period to a level lower than the sampling signal negatively fed back in the first period, whereby the amplification degree of the vertical output stage for the first period being thus made equal to that for the second period.

2. A vertical deflection circuit according to claim 1, in which said negative feedback amount-correcting means includes current-dividing means for dividing the deflection current flowing into said sampling means, said current-dividing means reducing the deflection current flowing in said sampling means during the second period to a level lower than the deflection current flowing in the sampling means during the first period.

3. A vertical deflection circuit according to claim 2, in which said current-dividing means includes a resistor and a switching member, said switching member being turned on thereby connecting said resistor in parallel to said sampling means in the second period, and said switching member being turned off thereby disconnecting said resistor from said sampling means in the first period.

4. A vertical deflection circuit according to claim 1, in which said vertical output stage includes a first NPN output transistor through which a vertical deflection current flows in the former half of the vertical scanning period and which is turned off in the latter half of the vertical scanning period, and a second NPN output transistor which drives said first NPN output transistor in the former half of the vertical scanning period and flows the vertical deflection current therethrough in the latter half of the vertical scanning period; and said negative feedback amount-correcting means including a resistor connected between the emitter of said second NPN output transistor and the junction point of said vertical deflection coil and said sampling means.

* * * * *